(12) United States Patent
Le Gars et al.

(10) Patent No.: US 7,729,822 B2
(45) Date of Patent: Jun. 1, 2010

(54) BICYCLE PROVIDED WITH AN ON-BOARD CONTROL SYSTEM AND AUTOMATIC RENTAL SYSTEM COMPRISING SAID BICYCLES

(75) Inventors: Jacques Le Gars, Gambais (FR); Jean-Claude Lamy, Rueil Malmaison (FR); Jacques Darras, Rambouillet (FR); Patrick Tavernier, Bouafle (FR)

(73) Assignee: JCDecaux SA, Neuilly sur Seine (FR)

( * ) Notice: Subject to any disclaimer, the term of this patent is extended or adjusted under 35 U.S.C. 154(b) by 901 days.

(21) Appl. No.: 10/597,834

(22) PCT Filed: Feb. 10, 2005

(86) PCT No.: PCT/FR2005/000316

§ 371 (c)(1),
(2), (4) Date: Oct. 13, 2006

(87) PCT Pub. No.: WO2005/077740

PCT Pub. Date: Aug. 25, 2005

(65) Prior Publication Data

US 2007/0158949 A1    Jul. 12, 2007

(30) Foreign Application Priority Data

Feb. 10, 2004    (FR) ................................. 04 01290

(51) Int. Cl.
*B62J 6/00* (2006.01)
*B62H 5/20* (2006.01)
*G01R 31/44* (2006.01)

(52) U.S. Cl. ............................ 701/29; 701/33; 701/35; 340/432

(58) Field of Classification Search ...................... None
See application file for complete search history.

(56) References Cited

U.S. PATENT DOCUMENTS

| 3,904,920 | A | | 9/1975 | Griffith | |
|---|---|---|---|---|---|
| 5,058,044 | A | * | 10/1991 | Stewart et al. | ............... 702/184 |
| 5,247,430 | A | * | 9/1993 | Schwaller | ................... 362/473 |
| 5,955,945 | A | | 9/1999 | Fuhrer | |
| 5,986,548 | A | | 11/1999 | McGregor | |
| 6,191,685 | B1 | | 2/2001 | Theofanous et al. | |
| 6,384,717 | B1 | * | 5/2002 | DeVolpi | ..................... 340/432 |
| 6,677,854 | B2 | * | 1/2004 | Dix | ............................ 340/438 |
| 6,690,267 | B2 | * | 2/2004 | Linden et al. | ............... 340/432 |

(Continued)

FOREIGN PATENT DOCUMENTS

DE      4324779 A1 * 3/1994

(Continued)

OTHER PUBLICATIONS

U.S. Appl. No. 60/458,473.*

(Continued)

*Primary Examiner*—Michael J. Zanelli
(74) *Attorney, Agent, or Firm*—McCracken & Frank LLP (57) ABSTRACT

A bicycle fitted with an on-board control system which is adapted in such a way that it can control the state of a functional element of the bicycle, in order to detect an error in the operation of said functional element and in order to signal said error.

26 Claims, 8 Drawing Sheets

U.S. PATENT DOCUMENTS

2002/0174077 A1* 11/2002 Yui et al. .................... 705/400
2004/0108683 A1* 6/2004 Oohara .................... 280/288.4
2004/0189722 A1* 9/2004 Acres ........................ 345/866

FOREIGN PATENT DOCUMENTS

| DE | 20114272 | | 2/2002 |
| DE | 10142358 | | 3/2003 |
| JP | 8-142967 | * | 6/1996 |
| JP | 2001-27058 | * | 1/2001 |
| JP | 2003 016567 | | 1/2003 |
| WO | WO 01/54080 | | 7/2001 |
| WO | WO 02/39787 | | 5/2002 |
| WO | WO 02/095698 | | 11/2002 |
| WO | WO 03/071493 | * | 8/2003 |

OTHER PUBLICATIONS

French Search Report (1 page) dated Aug. 27, 2004, Appl. No. FR 0401290.

International Search Report (6 pages) dated May 30, 2005, Appl. PCT/FRO5/000316.

* cited by examiner

BICYCLE PROVIDED WITH AN ON-BOARD CONTROL SYSTEM AND AUTOMATIC RENTAL SYSTEM COMPRISING SAID BICYCLES

FIELD OF INVENTION

The invention relates to bicycles provided with on-board control systems and to automatic rental systems comprising such bicycles.

More particularly, the invention relates to a bicycle provided with an on-board control system and a first communication interface electrically linked to the control system, said bicycle comprising at least one functional element.

BACKGROUND OF THE INVENTION

An example of a bicycle of this type is disclosed in document WO-A-01/54080.

These days, some towns are provided with automated bicycle rental systems enabling citizens to take a bicycle for an urban journey.

The rental can be subject to certain payment, and generally fine-enforced conditions, the latter condition aiming to safeguard the renter against theft and any damage associated with the day-to-day use of the bicycles.

However, it is also necessary to provide maintenance procedures, in order to guarantee the users bicycles in perfect working order.

These days, maintenance is normally performed by technicians who carry out regular checks on each bicycle.

Although flexible, since it involves a human workforce, such a procedure is, however, relatively complex.

In practice, it requires, for each bicycle, knowing the position of the latter on the date indicated in the schedule, then going to it to perform the maintenance check during which the state of various functional elements of the bicycle is checked (in particular tires, wheel rims, brakes and lamps).

Depending on the state of these elements, the bicycle can be:

either immobilized for repair if an element is found to be defective;

or returned to circulation when the state of the bicycle is considered satisfactory.

It can easily be understood that as the size of the fleet of bicycles increases (in some towns, this fleet can have several hundred bicycles), this type of procedure becomes extremely complex to organize.

Furthermore, it may be that a bicycle suffers a failure or a malfunction without any maintenance operation being imminently scheduled. Since it is rare for a user who has observed—or caused—a failure or a malfunction to notify the renter's maintenance departments himself, the bicycle is de facto immobilized until the next maintenance operation, because users normally do not accept the use of a defective bicycle.

The result is a loss of profitability in operating the fleet.

OBJECTS OF THE INVENTION

The invention aims mainly to overcome the abovementioned drawbacks, by proposing a bicycle offering enhanced ergonomyU and/or with maintenance made easier. The invention also aims, in a context like that explained above, to simplify the management of a fleet of bicycles.

SUMMARY OF THE INVENTION

To this end, the invention proposes a bicycle fitted with an on-board control system and a first communication interface electrically linked to the control system, said bicycle comprising at least one functional element, characterized in that said control system is designed to:

control the state of the functional element, and communicate to a fixed infrastructure, via the first communication interface, status information concerning the state of said functional element.

The status information can then be processed to notify a maintenance department of the existence of any faults and of the need for servicing.

The result of this is, on the one hand, enhanced ergonomy of the bicycle on which there is no need to carry out the usual checks for failures or faults, since it is equipped with a built-in failure detection system and, on the other hand, a significantly enhanced management of a fleet comprising such bicycles.

In various embodiments of the bicycle according to the invention, use may also be made of one and/or the other of the following arrangements which can be used, as appropriate, independently of each other and/or independently of the abovementioned provisions:

said first communication interface comprises a transceiver;

said first communication interface is a short-range, contactless communication interface;

the control system is designed to:

detect a fault in the operation of said functional element, and generate status information characteristic of said fault and communicate this status information to the first communication interface for transmission to said infrastructure;

the bicycle comprises a main rear lighting circuit comprising a first rear lamp, the control system being designed to:

control said main rear lighting circuit, and detect a failure in said main rear lighting circuit;

the main rear lighting circuit comprises, in series, a current amplifier, a light-emitting diode, and a current detector;

the bicycle comprises a secondary rear lighting circuit independent of the main rear lighting circuit, said secondary rear lighting circuit comprising a second rear lamp, and in which the control system is designed to control the secondary rear lighting circuit by making it operate when a failure has been detected in the main rear lighting circuit;

the bicycle comprises at least one brake and a secondary rear lighting circuit independent of the main rear lighting circuit, said secondary rear lighting circuit comprising a second rear lamp, the control system being designed to:

detect the actuation of the brake, and control the secondary rear lighting circuit by making it operate when the actuation of the brake has been detected;

the secondary rear lighting circuit comprises, in series, a current amplifier, a light-emitting diode, and a current detector;

the bicycle comprises a dynamo, and the control system comprises a memory and is designed to:

measure an electrical intensity of a current generated by the dynamo, write to the memory status information characteristic of a failure of the brake when the control system detects the actuation of said brake without detecting a reduction in said electrical intensity,
transmit said status information characteristic of a failure of the brake to the first communication interface;
the bicycle comprises two independent front lighting circuits, each comprising at least one front lamp, and in which the control system is designed to:
supply current, at mid-power, to each front lighting circuit,
detect a failure in any one of the front lighting circuits, and
supply one of the front lighting circuits with current, at full power, when a failure has been detected in the other circuit;
each front lighting circuit comprises, in series, a current amplifier, at least one light-emitting diode, and a current detector;
the bicycle comprises:
at least one front lighting circuit comprising at least one front lamp,
at least one rear lighting circuit comprising a first rear lamp,
a dynamo,
a battery electrically linked to the dynamo to be recharged by said dynamo and at least partly supplying the front and rear lighting circuits,
and the control system is designed to:
control the front and rear lighting circuits,
measure the battery charge,
reduce an electrical intensity supplying the front lighting circuits when the measured charge is less than a predetermined minimum value;
the bicycle comprises:
at least one front lighting circuit comprising at least one front lamp,
at least one rear lighting circuit comprising a first rear lamp,
a dynamo,
a battery electrically linked to the dynamo to be recharged by said dynamo and at least partly supplying the front and rear lighting circuits,
and the control system comprises a clock and is designed to:
control the front and rear lighting circuits,
detect the operation of the dynamo,
cut said front and rear lighting circuits when a time interval of predetermined duration has elapsed after the dynamo has stopped operating;
the control system comprises a memory and is designed to:
receive an identification code via the first communication interface,
write said identification code into the memory,
detect an operation of the bicycle,
if the bicycle is operating, compare the value of the identification code with at least one predetermined value,
and, depending on this comparison, initiate or not initiate an alarm reaction;
the control system is designed to initiate the alarm reaction when the value of the identification code corresponds to said predetermined value;
the control system comprises a clock and is designed to:
detect an operation of the bicycle,
after a predetermined period of operation of the bicycle, initiate an alarm reaction;
the bicycle comprises at least one lighting circuit which comprises at least one lamp,
and the control system is designed to intermittently control the lighting circuit as an alarm reaction;
the bicycle comprises a speaker controlled by the control system, and the control system is designed to have a sound signal sent to this speaker as an alarm reaction;
the control system is designed to detect a movement of the bicycle and to determine that the bicycle is operating when a movement is detected;
the bicycle can be locked on a fixed terminal and the control system is designed to:
detect a locking of the bicycle on a fixed terminal,
have an acknowledgement signal sent when the locking of the bicycle on the terminal has been detected;
the bicycle comprises at least one lighting circuit controlled by the control system, and said control system is designed to have said lighting circuit operate intermittently for a limited period as an acknowledgement signal.

Another subject of the invention is a bicycle comprising at least one dynamo, a brake and an on-board control system designed to:
detect an actuation of the brake,
measure an electrical intensity of a current generated by the dynamo,
and identify a failure of the brake when the control system detects the actuation of said brake without detecting a reduction in said electrical intensity. The control system may then, if necessary, include writing to a memory status information characteristic of the failure of the brake. Furthermore, the bicycle may comprise a first communication interface and the control system may be designed to communicate to a fixed infrastructure, via the first communication interface, said status information concerning the failure of the brake.

Another subject of the invention is a bicycle comprising an on-board control system comprising a memory and linked to a first communication interface, said control system being designed to:
receive an identification code from a fixed infrastructure via the first communication interface,
write said identification code into the memory,
detect an operation of the bicycle,
if the bicycle is operating, compare the value of the identification code with at least one predetermined value,
and depending on this comparison, initiate or not initiate an alarm reaction.

Another subject of the invention is a bicycle comprising an on-board control system comprising a clock and designed to:
detect an operation of the bicycle,
after a predetermined bicycle operation time, initiate an alarm reaction.

Moreover, another subject of the invention is an automatic bicycle rental system comprising at least one bicycle as defined above and an infrastructure designed to receive said status information.

In various embodiments of the bicycle rental system according to the invention, use can also be made of one and/or the other of the following arrangements:
the automatic system comprises a plurality of bicycles and said infrastructure comprises:
a plurality of storage stations designed to receive on each at least one bicycle for storage purposes,
and a plurality of short-range second communication interfaces designed to communicate with said first communication interfaces of the bicycles, each second communication interface of the infrastructure being associated with at least one storage station and disposed in the immediate vicinity of said storage station;

each storage station comprises a fixed terminal;

the fixed terminal comprises one of said second communication interfaces;

said second communication interface is a contactless communication interface comprising a transceiver;

the infrastructure also comprises at least one central station centralizing said status information received by all the second communication interfaces.

BRIEF DESCRIPTION OF THE DRAWINGS

Other subjects and advantages of the invention will become apparent in light of the description given below, with reference to the appended drawings in which.

DETAILED DESCRIPTION OF THE PREFERRED EMBODIMENTS

Figure 1:
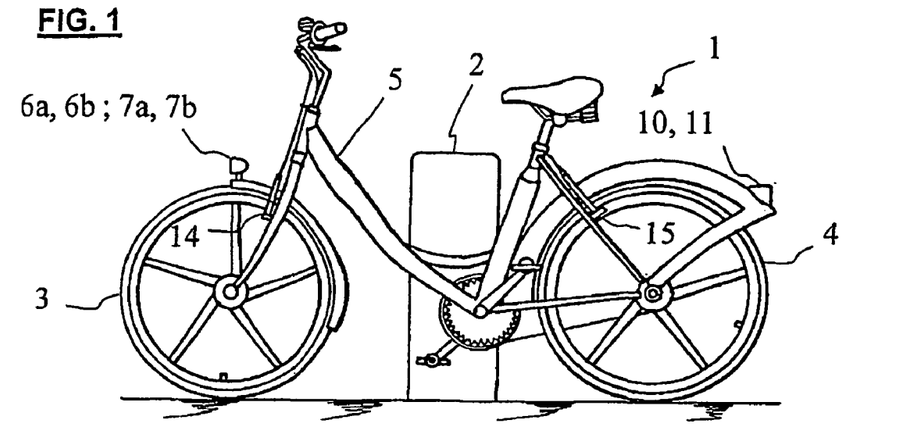
FIG. 1 is a side elevation view of a bicycle according to the invention, provided with an on-board control system; the bicycle is represented in a put-away position in which it is temporarily fixed to a fixed terminal.

FIG. 1 shows a bicycle 1 belonging to a fleet of bicycles offered for rental in an urban environment. This fleet of bicycles 1 is part of an automatic bicycle rental system which also comprises a fixed infrastructure including in particular fixed terminals 2 or other bicycle storage stations to which the bicycles can be locked pending being taken.

The bicycle 1 is here shown in a put-away position where it is temporarily fixed to a storage terminal 2, which is provided with a locking system (not represented) which cooperates with attachment means (not represented) provided on the bicycle 1 to prevent its use by an unauthorized person.

At the request of a user having followed a rental procedure possibly including a payment step, the locking system can be disabled to allow the user to use the bicycle 1 for a predetermined period.

A procedure for renting a bicycle, a terminal and its locking means are described in detail in the international applications published under numbers WO-02/095698 and WO-01/54080 in the name of the Applicant, to which those skilled in the art can refer.

The bicycle 1 comprises a front wheel 3 and a rear wheel 4 both mounted to rotate on a frame 5.

Figure 2:
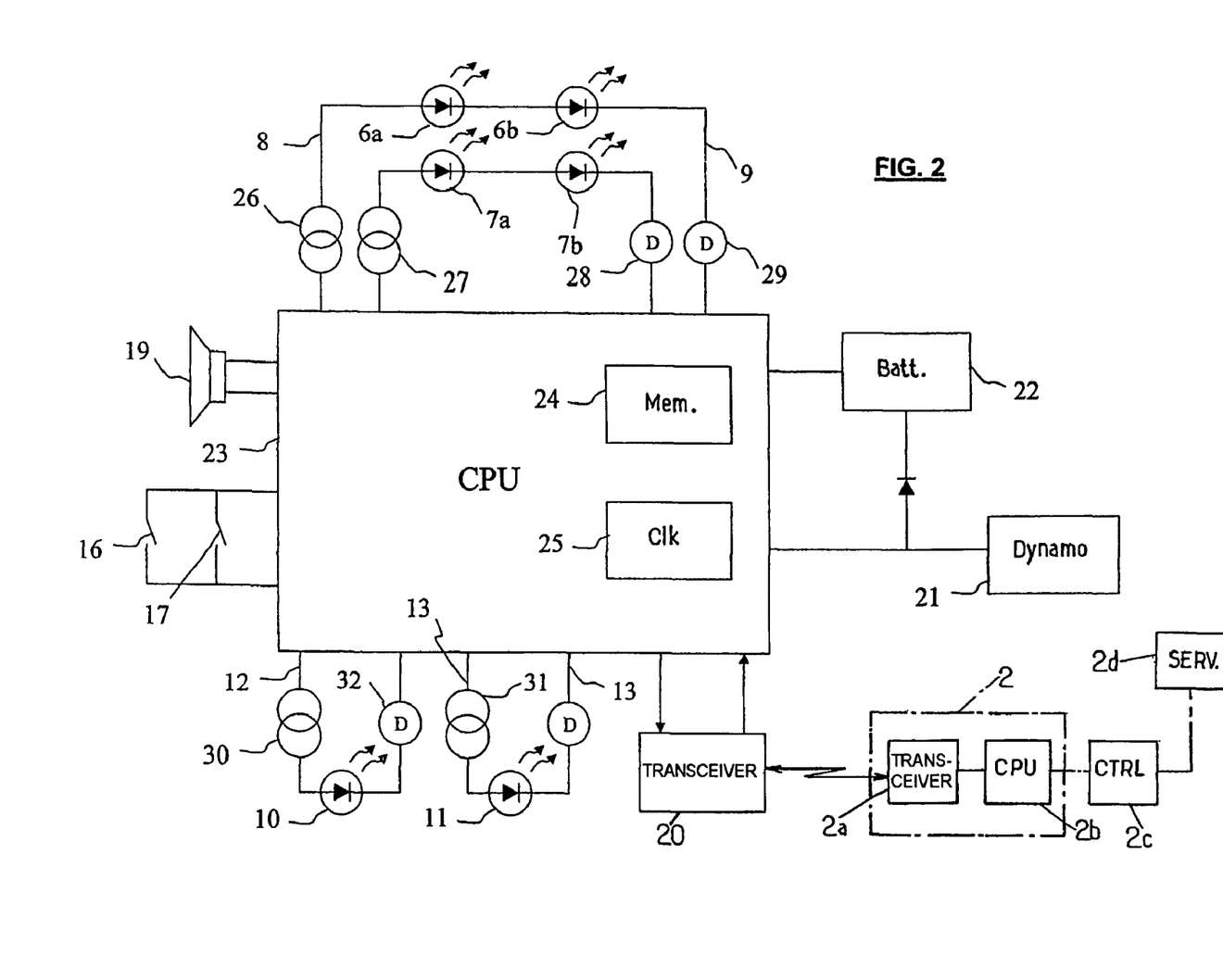
FIG. 2 is a diagram illustrating the on-board control system of the bicycle of FIG. 1 and a part of the fixed infrastructure of the bicycle rental system.

This bicycle 1 is also equipped:

with two pairs of front lamps 6a, 6b, 7a, 7b mounted on two separate electrical circuits, namely a primary front circuit 8 and a secondary front circuit 9, each pair of lamps comprising, on the one hand, a port-side front lamp 6a, 7a, designed to light the left side of the bicycle 1, and on the other hand, a starboard-side front lamp 6b, 7b, designed to light the right side of the bicycle 1;

two rear lamps 10, 11 respectively belonging to two separate electrical circuits, namely a primary rear circuit 12 and a secondary rear circuit 13;

two brakes, namely a front brake 14 designed to clamp the front wheel 3 and a rear brake 15 designed to clamp the rear wheel 4, these brakes 14, 15 being linked to two switches 16, 17 mounted in parallel on an electrical circuit 18, each switch 16, 17 being in the open state when the corresponding brake 14, 15 is idle, and in the closed state when the corresponding brake 14, 15 is actuated;

a speaker 19;

a first short-range, contactless communication interface 20, for example a radio wave transceiver; this first communication interface is designed to communicate with a second communication interface 2a, identical or similar, belonging to the fixed infrastructure of the bicycle rental system, this second communication interface possibly, for example, being included in the terminal 2 and being linked to an electronic central processing unit 2b (CPU), itself possibly included in the terminal 2, and the central processing unit 2b communicating with a central server 2d (SERV.) common to all or some of the terminals 2 of the system (possibly, the terminals 2 located in the same place can communicate with a controlling terminal comprising a controlling central processing unit 2c (CTRL), itself linked to the server 2d);

a dynamo 21, mounted on one of the wheels 3, 4, and an accumulator battery 22 (Batt.).

Each of the abovementioned elements of the bicycle is electrically linked to a processor 23 (also called CPU according to the international terminology) electrically powered by the dynamo 21 which, when the bicycle 1 is moving, keeps the battery 22 charged.

The CPU 23 comprises a flash memory 24 (Mem.) in which, as will be seen later, is stored data relating to the state of the bicycle 1, and an internal clock 25 (Clk), the use of which will become apparent below. The CPU 23 forms an on-board control system, designed to manage the operation of certain elements of the bicycle 1 and detect any failures.

The dynamo 21 may, for example, be incorporated in the hub of one of the wheels, for example the front wheel 3, for compactness purposes and to avoid the possible damage to which conventional friction dynamos are subject.

Patents have been filed in the past for such dynamos incorporated in a hub. Those skilled in the art can refer to them.

As can be seen in FIG. 1, each front lamp 6a, 6b, 7a, 7b may, for example, comprise a light-emitting diode (also called LED according to international usage).

In order to ensure a good brightness of the LEDs (and consequently a good visibility of the bicycle), each front circuit 8, 9 comprises a current amplifier 26, 27 at the output of the CPU 23. Each front circuit 8, 9 also comprises a current detector 28, 29 to measure the current flowing in the circuit.

Thus, each front circuit 8, 9 comprises, in series, in turn and in the direction of the current: a current amplifier 26, 27, two LEDs 6a, 6b, 7a, 7b and a current detector 28, 29.

Figure 3:
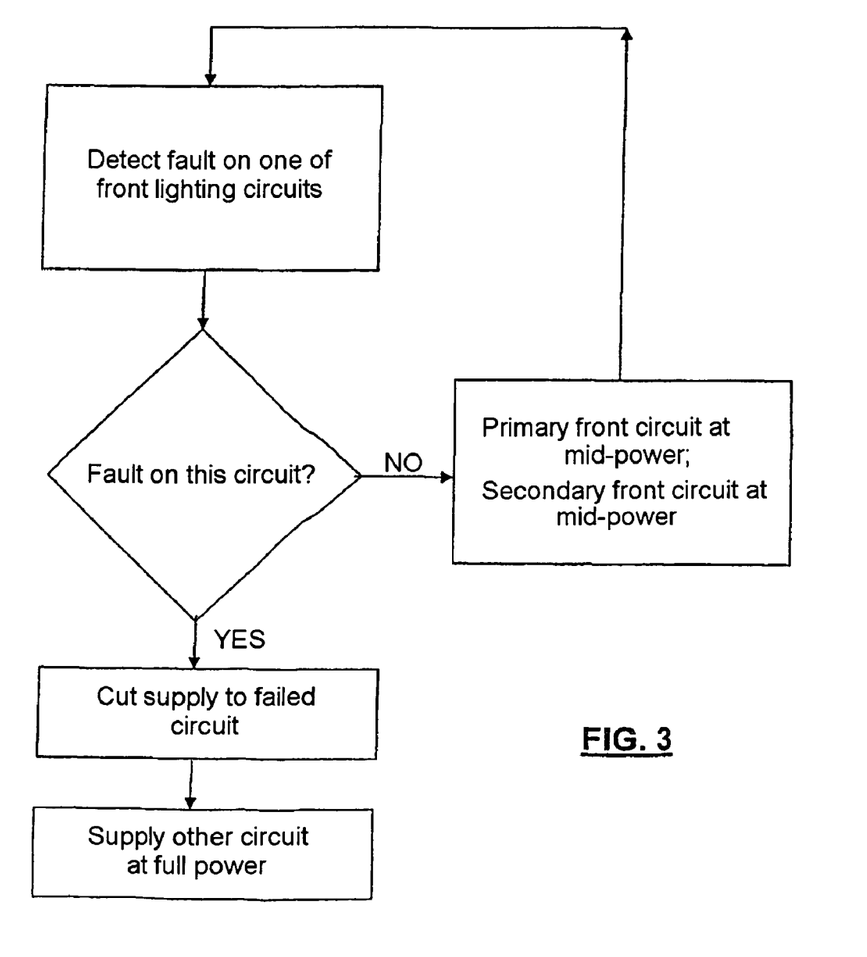
FIGS. 3 to 9 are diagrams illustrating various control operations performed on functional elements of the bicycle.

The operation of the front lighting is managed by the control system 23, as follows (refer to FIG. 3).

The CPU 23 begins by checking whether the bicycle 1 is moving (this check can be made by means of an instrumented bearing provided in the hub of one of the wheels 3, 4, the bearing being electrically linked to the CPU 23, or by means of a charge signal from the dynamo 21).

While the CPU 23 detects the bicycle 1 moving, it supplies constant intensity current, produced by the dynamo 21, to the primary and secondary circuits 8, 9.

Moreover, while the CPU 23 detects the bicycle 1 moving, it detects at each instant whether a fault appears in one of the primary or secondary circuits 8, 9.

As long as no fault is detected, the CPU 23 supplies the circuits 8, 9 with a current, of which the intensity, called normal intensity, represents only a portion of the maximum intensity allowable by the LEDs 6a, 6b, 7a, 7b. According to a particular embodiment, this normal intensity is equal to only half of the maximum allowable intensity. In other words, the circuits 8, 9 are supplied at mid-power. Given the presence of four LEDs 6a, 6b, 7a, 7b and the distribution on either side of the bicycle 1—on port side and on starboard side—the quality of the lighting does not suffer from this mid-power supply, while significant energy savings are obtained.

However, when a fault appears, for one reason or another (for example when an LED fails), it is immediately detected by the current detector 28, 29, which then measures a variation of intensity in the corresponding circuit 8, 9.

The CPU 23 then immediately cuts the supply to the failed circuit (for example, the primary circuit 8) and increases the intensity of the supply current to the other circuit (in this case, the secondary circuit 9) to its maximum allowable value (in other words, this circuit is supplied at full power).

The CPU 23 then generates a signal characteristic of the fault detected, intended for the flash memory 24, in which there is then stored an identifier characteristic of the failed state of the circuit concerned.

When the bicycle 1 is returned by its user who locks it to a free terminal 2, the CPU 23 interrogates the memory 24 and, when the latter contains an identifier characteristic of a fault in a front lighting circuit 8, it communicates to the terminal 2, via the transceiver 20, an error message for the attention of the maintenance department in order to notify the latter that servicing is needed on the front lighting. The rental of the bicycle 1 can be prevented until this servicing has been performed.

The rear lighting circuits 12, 13 may, for example, be identical or similar to the front lighting circuits 8, 9, except that each rear lighting circuit comprises only one LED, and that this LED is of lower power than the LEDs of the front lighting.

In order to ensure a good brightness of the LEDs 6a, 6b, 7a, 7b, each rear circuit 12, 13 comprises a current amplifier 30, 31 at the output of the CPU 23, and a current detector 32, 33 to measure the current flowing in the circuit 12, 13.

Thus, each rear circuit comprises, in series, successively and in the direction of the current: a current amplifier 30, 31, an LED 10, 11 and a current detector 32, 33.

Figure 4:
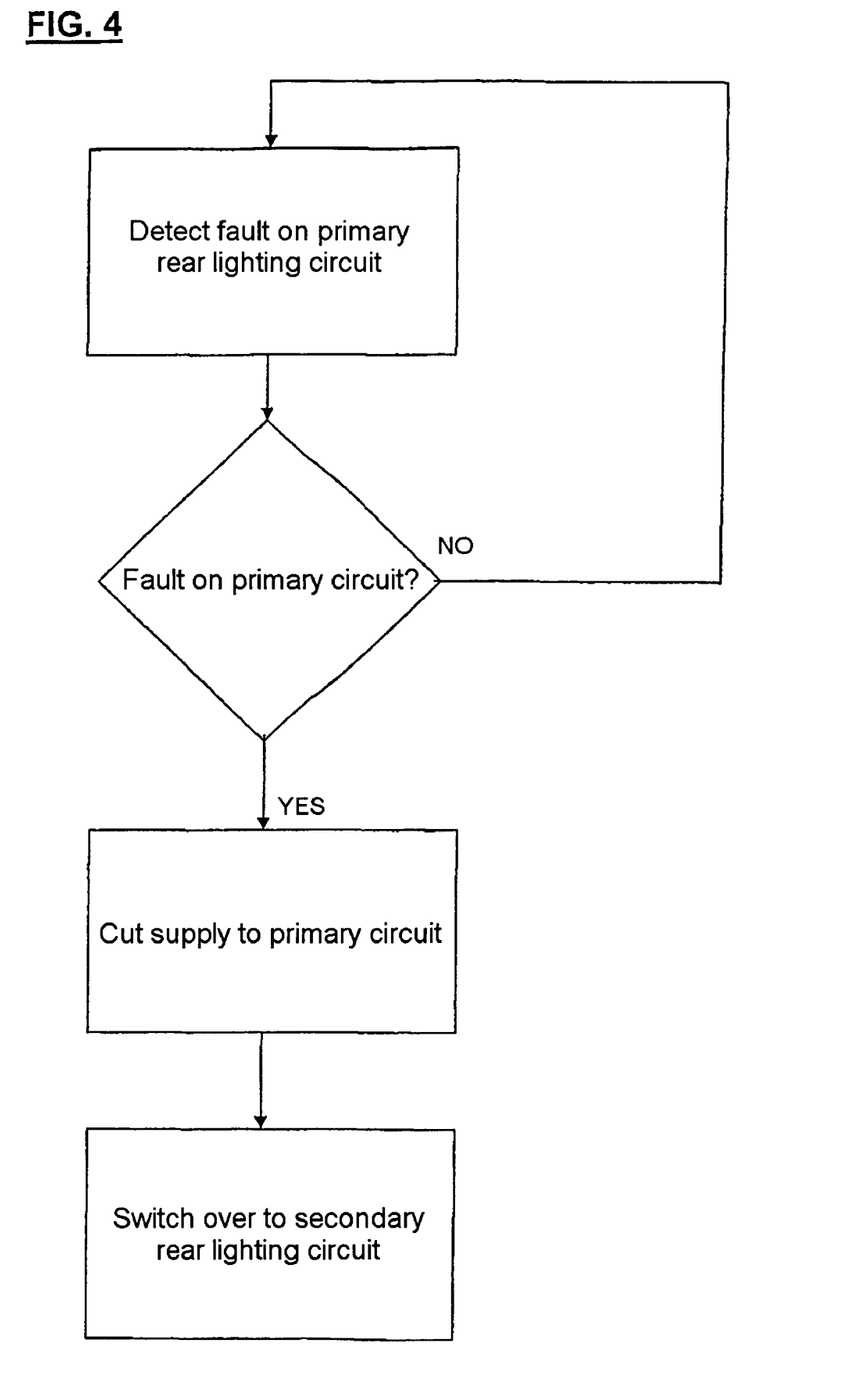

The operation of the rear lighting is managed by the control system 23, as follows (refer to FIG. 4).

The CPU 23 begins by checking whether the bicycle 1 is moving, in the same way as for the front lighting (see above).

While the CPU 23 detects the bicycle 1 moving, it supplies constant intensity current, produced by the dynamo 21, to the primary circuit 12, while the secondary circuit 13, which constitutes a backup circuit, is not supplied.

Moreover, while the CPU 23 detects the bicycle 1 moving, it detects at each instant whether a fault appears in the primary circuit 12.

As long as no fault is detected, the primary circuit 12 is supplied with current by the CPU 23.

However, when a fault appears in the primary circuit 12, it is immediately detected by the current detector 32.

The CPU 23 then immediately cuts the supply to the primary circuit 12 (failed) and supplies current to the secondary circuit 13 which takes over.

The CPU 23 then generates a signal characteristic of the fault detected, intended for the flash memory 24, in which is then stored an identifier characteristic of the failed state of the primary circuit 12.

When the bicycle 1 is returned by its user who locks it to a free terminal 2, the CPU 23 interrogates the memory 24 and, when the latter contains an identifier characteristic of a fault in the primary rear lighting circuit 12, it communicates to the terminal, via the transceiver 20, an error message for the attention of the maintenance department in order to notify the latter that servicing is needed on the rear lighting. The rental of the bicycle 1 is not necessarily prevented, as long as the secondary circuit 13 has not also failed. However the procedure for automatically checking the state of the secondary circuit 13 is then repeated in the same way as described previously for the primary circuit 12.

And, when the secondary circuit 13 in turn fails, the bicycle 1 can be disabled until servicing has been performed on one and/or the other of the circuits 12, 13.

Moreover, when the immobility of the bicycle 1 is detected by the CPU 23 (for example, when the bicycle 1 is stopped at a traffic light or when it is put away after having been returned by its renter), the CPU 23 orders a countdown by means of the clock 25 (for example, of around 30 seconds).

During this countdown, the electrical supply to the CPU 23 is automatically provided by the battery 22, to which the dynamo 21 switches over on stopping.

If, before the end of the countdown, the CPU 23 detects a movement of the bicycle 1 (for example, if the rider starts after having been temporarily immobilized at a traffic light), the supply to the CPU 23 switches back to the dynamo 21 and the process is restarted.

If, however, the countdown ends without the CPU 23 detecting a movement of the bicycle 1, the CPU orders the lamps to be switched off, both front 6a, 6b, 7a, 7b and rear 10, 11, in order to obtain energy savings and not to discharge the battery 22.

With the on-board control system 23, it is also possible to automatically detect a fraudulent use (that is, resulting from theft of the bicycle) or unauthorized use (that is, use of the bicycle 1 beyond a predetermined borrowing period on the expiry of which the user should have returned the bicycle 1).

In order to report a fraudulent use (refer to FIG. 5), the bicycle 1 has associated with it a general identifier stored in the memory 24. When the bicycle 1 is put away, which the CPU 23 can detect by means of a signal received from the locking system of the terminal 2 when the latter is activated, the general identifier is assigned a predetermined value independent of the user, for example the zero value (0000).

Figure 5:
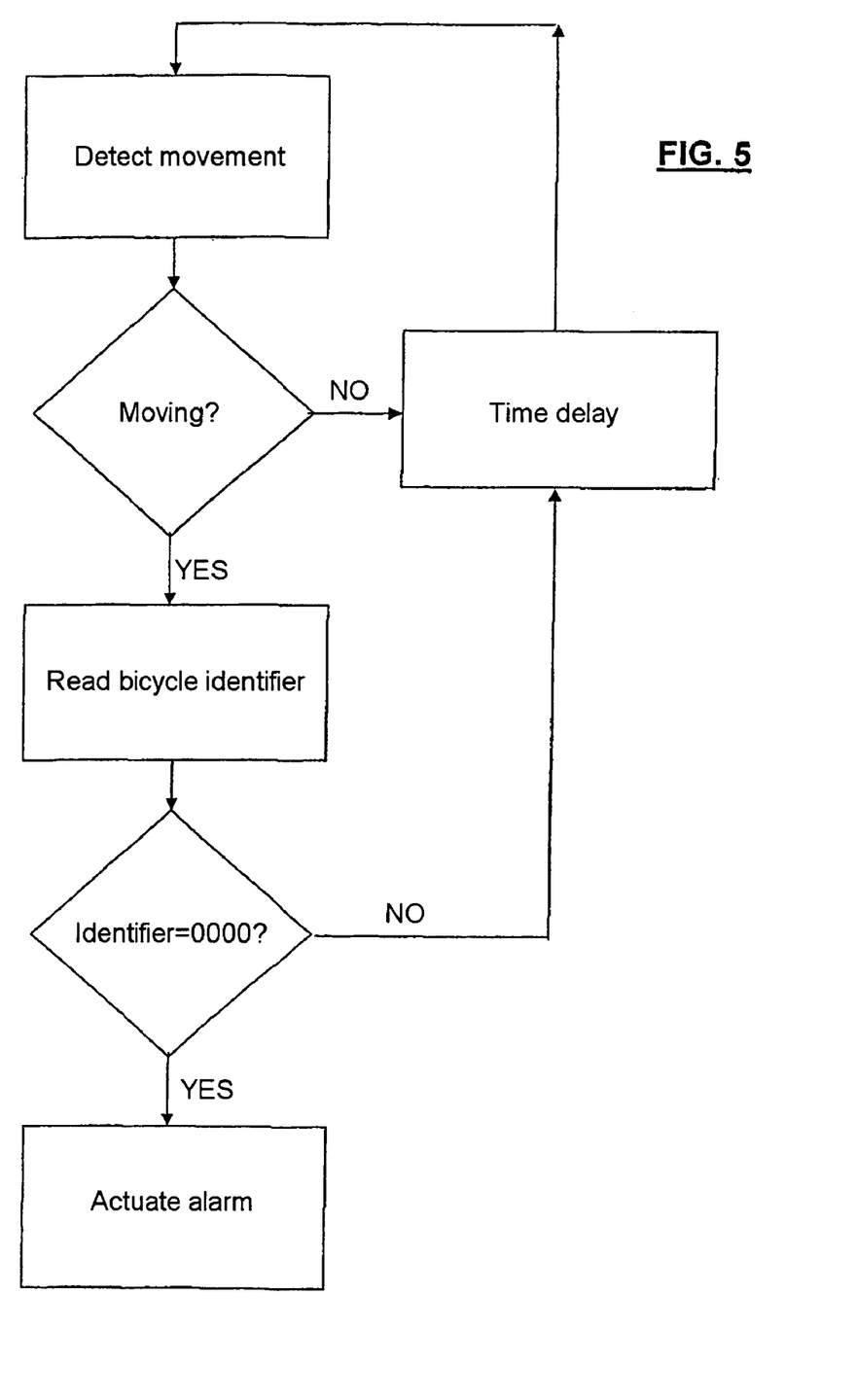

When the user has correctly completed the rental steps for the bicycle 1, the latter is assigned an identifier corresponding to the user (which has a corresponding non-zero stored value).

The CPU 23 detects whether the bicycle is moving. If it is not, the CPU 23 orders a time delay, by means of the clock 25 (for example a countdown of ten minutes or so), before renewing the detection.

When the movement of the bicycle 1 is detected, the CPU 23 reads the stored identifier.

If this identifier is non-zero, the procedure is repeated.

When the identifier is zero, which means that the bicycle 1 has been borrowed fraudulently, the CPU 23 actuates an audible and/or visual alarm.

For example, the CPU 23 can then supply current to the speaker 19 which produces a siren noise in order to attract attention to the bicycle 1 and, above all, to its fraudulent user. The front lamps 6a, 6b, 7a, 7b and/or rear lamps 10, 11 can, independently or simultaneously, be lit intermittently in order for the resulting flashing also to attract attention and urge the fraudulent user to move away from the bicycle.

In order, moreover, to detect any unauthorized use (refer to FIG. 6), the CPU 23 detects at each instant whether the bicycle 1 is moving. At the moment when the bicycle 1 is taken, the CPU 23 generates in the clock 25 a countdown for a period of a predetermined duration (for example 4 hours).

Figure 6:
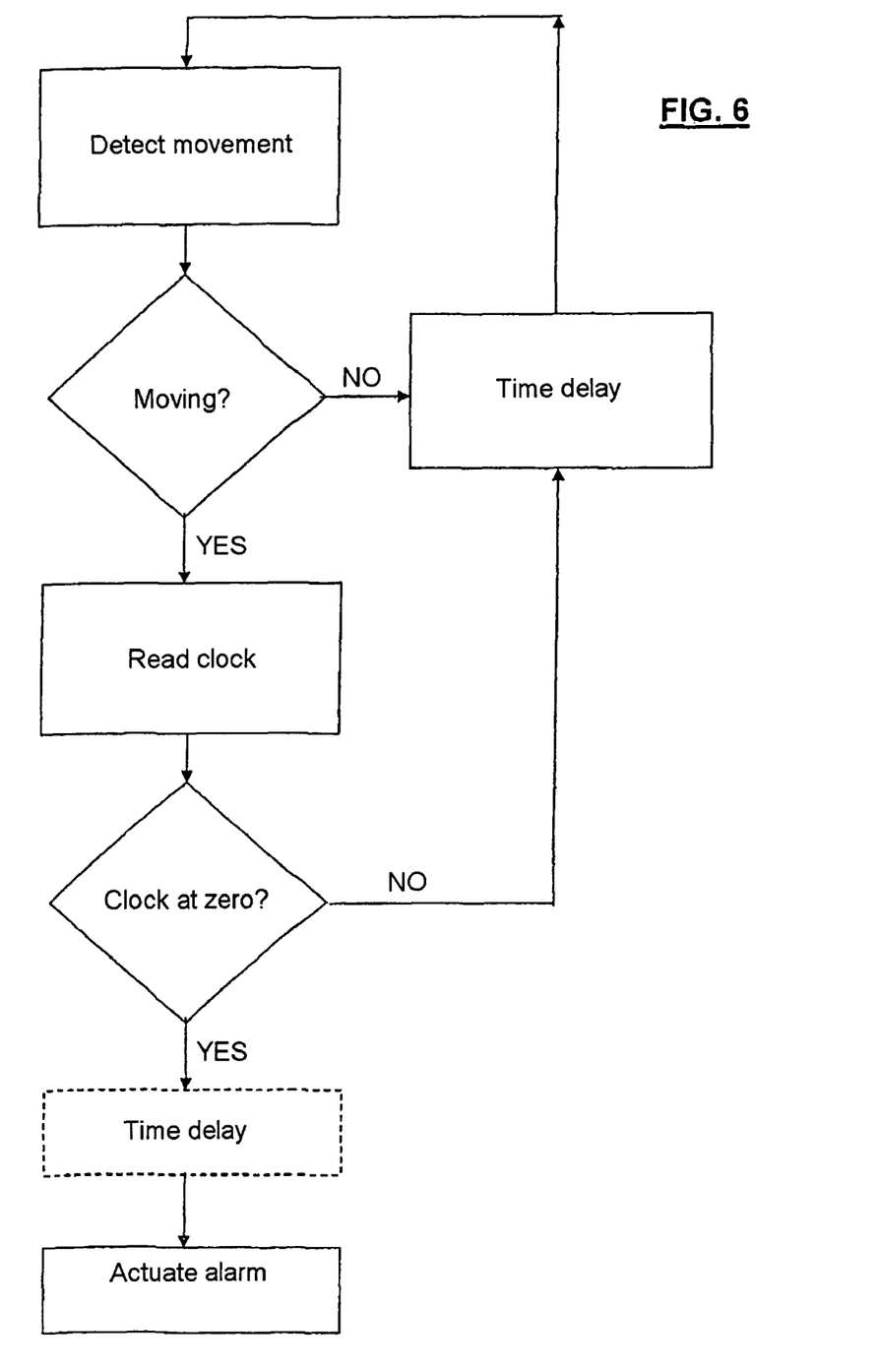

If the countdown ends before the CPU 23 has detected the locking of the bicycle 1, which means that the bicycle 1 is being used beyond the authorized period, the CPU 23 actuates an audible and/or visual alarm, in the same way as described above for the fraudulent use of the bicycle.

The CPU 23 may not immediately initiate the alarm, but order a time delay by means of the clock 25, and initiate the alarm only at the end of this time delay (the duration of which is, for example, equal to four times the duration of the authorized period), so as to allow the honest user a certain delay (for example, to allow him time to find a free terminal when all the terminals located near his destination are occupied).

Figure 7:
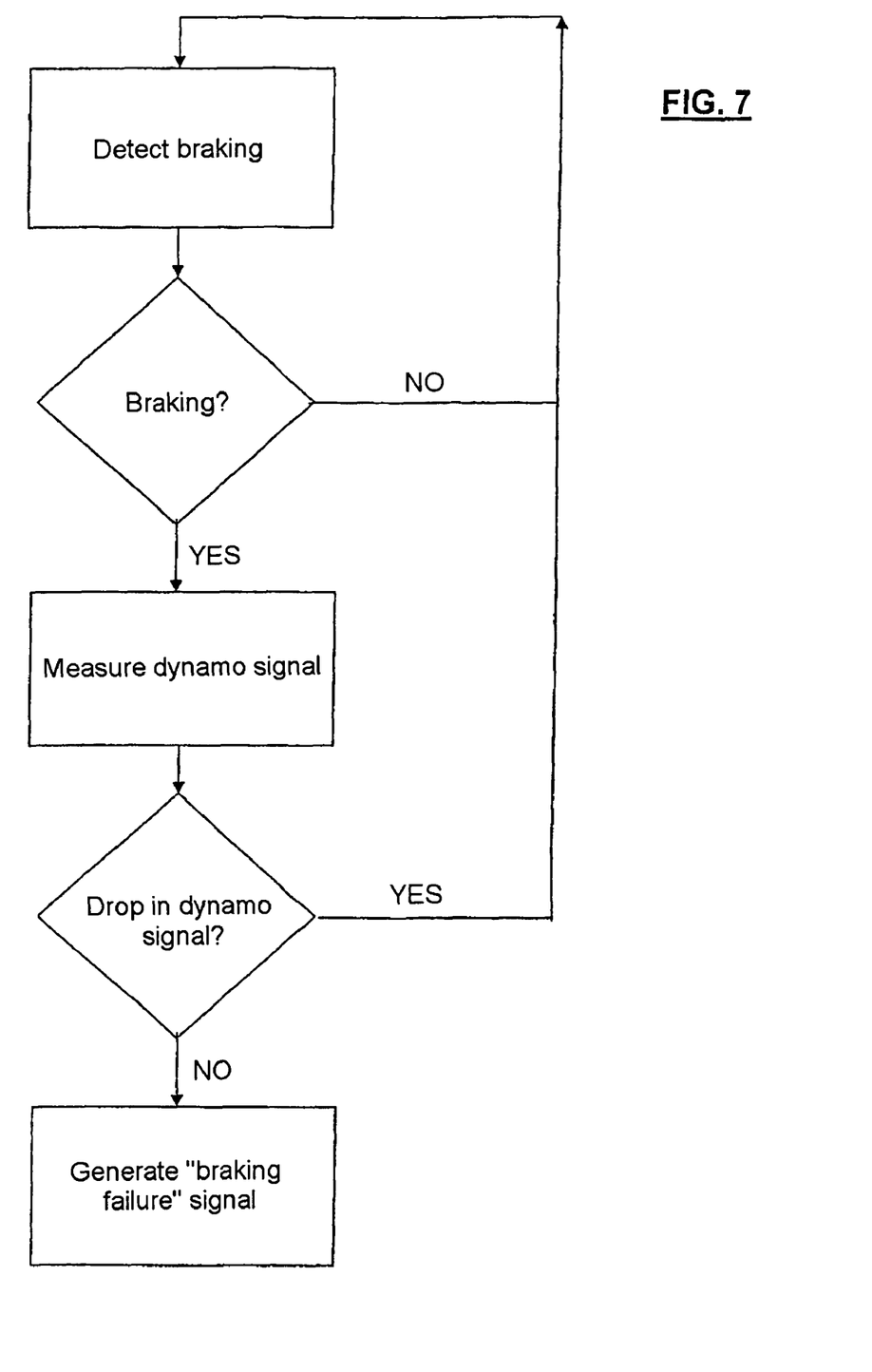

Moreover, with the on-board control system 23, it is also possible to detect any failure of the brakes 14, 15 (refer to FIG. 7).

According to an embodiment illustrated in FIG. 1, the front brakes 14 and rear brakes 15 are respectively linked to a front switch 16 and a rear switch 17 mounted in parallel on a circuit 18 electrically linked to the CPU 23.

These switches 16, 17, normally open, close when the front brake 14 or, respectively, the rear brake 15, is actuated, so that the CPU 23 immediately detects the braking of the bicycle 1.

When this braking is detected, the CPU 23 supplies current to the secondary rear lighting circuit 13, so as to light the corresponding LED 11, which thus acts as a stop light (whereas, as seen above, the main rear light acts as a position light).

The result of this is better safety for the cyclist, with any drivers or any cyclists behind being alerted to the braking.

Simultaneously, the CPU 23 checks that the value of the intensity of the supply current from the dynamo 21 starts to drop, which is the indication of a decrease in the speed of the bicycle 1.

When the CPU 23 detects the actuation of the brakes 14, 15, without simultaneously detecting a drop in the value of the intensity from the dynamo 21, which means that the brakes 14, 15 are not carrying out their function, the CPU 23 generates a signal characteristic of a braking fault, and writes to the flash memory 24 an identifier characteristic of the failed state of the brakes.

When the bicycle 1 is returned by its user who locks it to a free terminal 2, the CPU 23 interrogates the memory and, when the latter contains an identifier characteristic of a braking fault, it communicates to the terminal 2, via the transceiver 20, an error message for the attention of the maintenance department in order to notify the latter that servicing is needed on the brakes 14, 15. Given the importance of the braking system, the rental of the bicycle 1 is then prevented until this servicing has been carried out.

Figure 8:
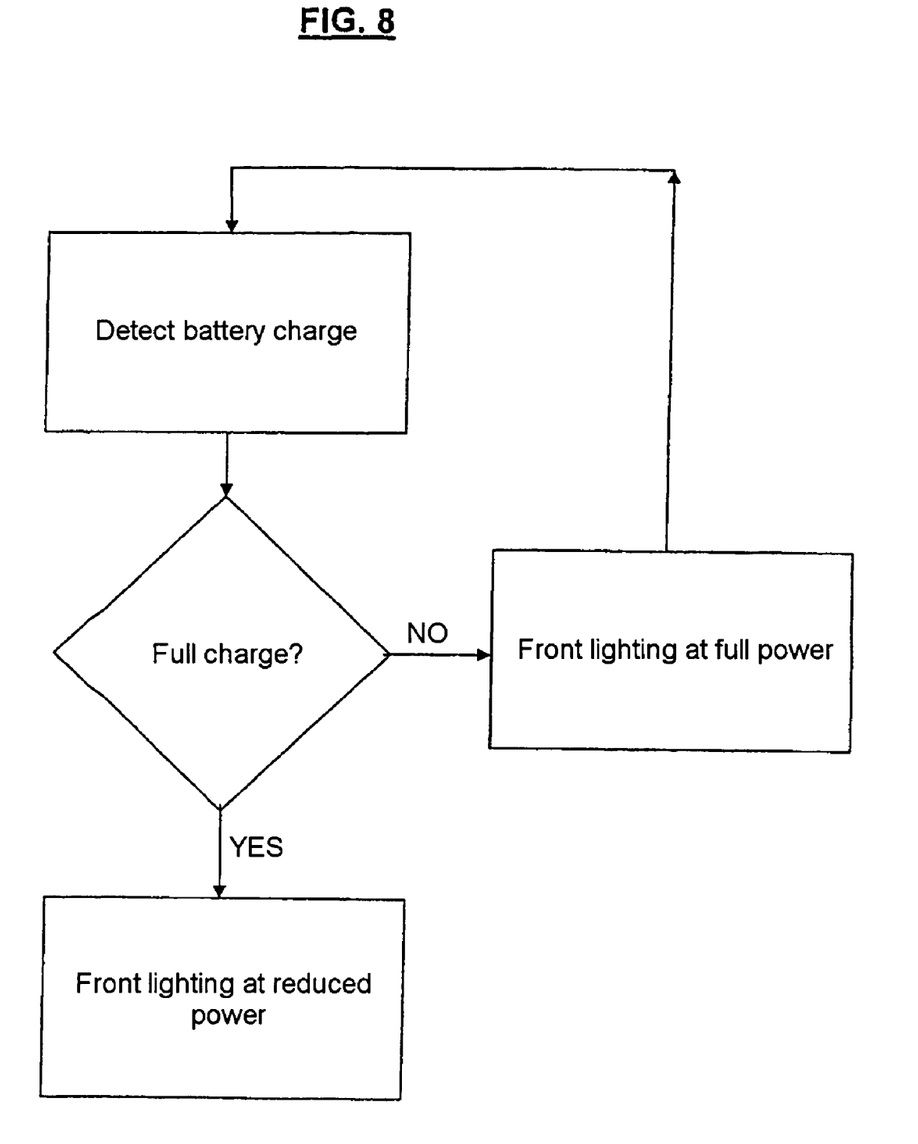

With the on-board control system 23, it is also possible to detect any failure of the dynamo 21 and to give priority to charging the battery 22 over lighting (refer to FIG. 8).

To this end, the CPU detects at each instant the charge of the battery (for example, by measuring the value of the intensity at the battery output).

When the battery 22 is fully charged and the CPU 23 detects that the bicycle 1 is moving, the front lighting circuits 8, 9 are supplied normally, as described above.

However, when the CPU 23 detects a discharging of the battery 22, priority is given to its charging over lighting. To this end, the CPU 23 reduces the value of the intensity of the current supplied to the front lighting circuits 8, 9, in order to increase the value of the intensity of the current supplied by the dynamo 21 to the battery 22.

When the charging of the battery 22 is complete, the CPU 23 again supplies the lighting circuits 8, 9 normally.

It is thus possible to charge the battery 22 more rapidly, benefiting the safety of the bicycle 1. At the moment when the bicycle 1 is returned by its renter, the charge level of the battery 22, previously written to the flash memory 24, is communicated, via the transceiver 20, to the terminal 2 which, when this charge level is less than a predetermined minimum authorized level, transmits a signal for the attention of the maintenance department in order to notify the latter that servicing is needed on the battery 22 or on the dynamo 21. It is possible to prevent the renting of the bicycle 1 until this servicing has been performed.

The on-board control system 23 can also be exploited to notify the user that the operations are running correctly, in particular when taking and returning the bicycle 1.

Thus, when the CPU 23 detects, when the bicycle 1 is taken, the separation from the terminal 2, it temporarily supplies (for example for a few seconds) the lighting circuits 8, 9 intermittently, in order to generate a flashing which notifies the user that the bicycle 1 is actually available.

Similarly, when the renter returns the bicycle 1 after using it, the CPU 23 detects whether the locking to the terminal 2 has been correctly completed, and, if it has, temporarily supplies the lighting circuits 8, 9 to generate a flashing to notify the renter that the bicycle has been replaced correctly. The CPU 23 then assigns the zero value 0000 to the general identifier of the bicycle 1. This value is written to the flash memory 24.

Figure 9:
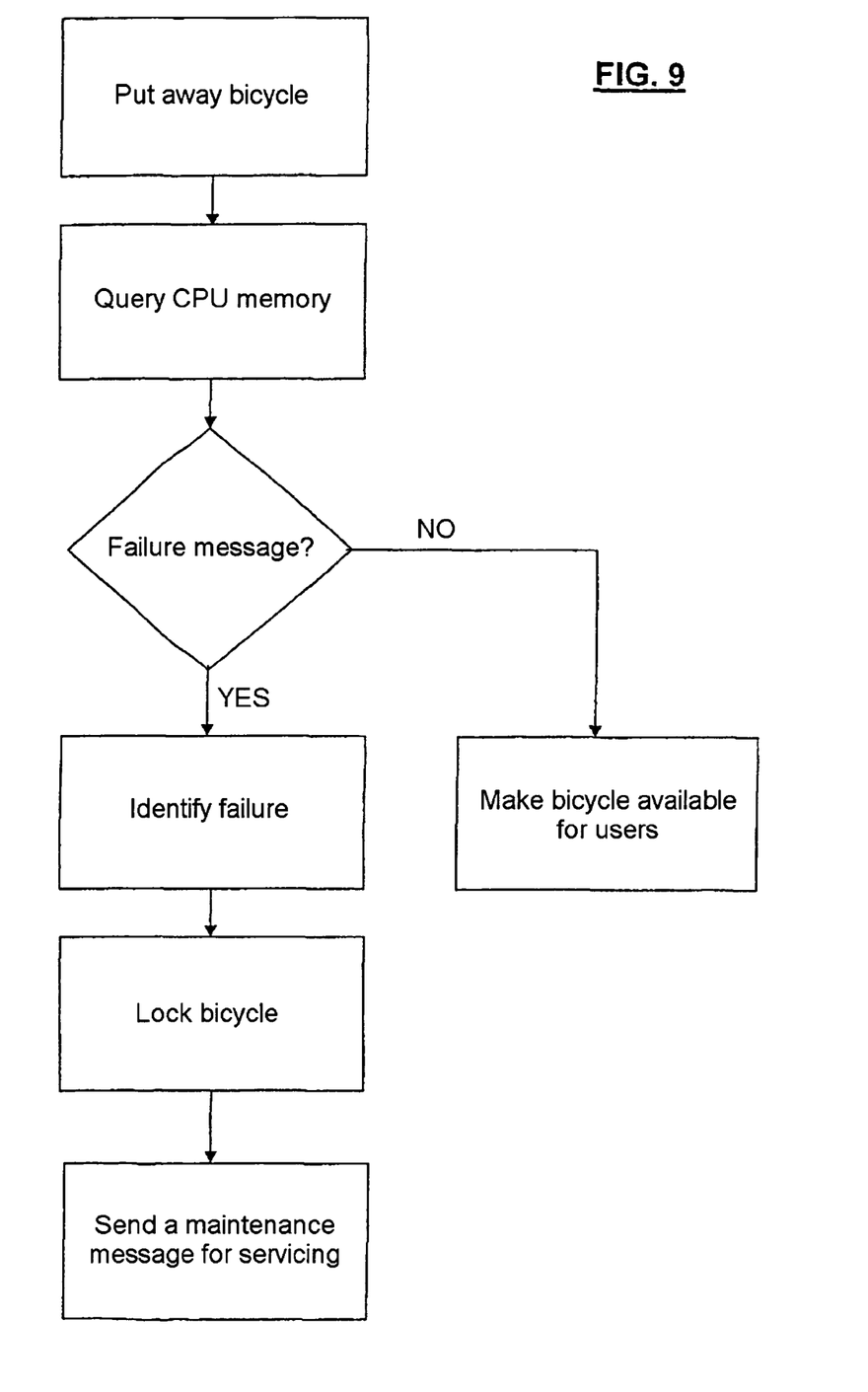

Thus, overall, the procedure followed when the bicycle 1 is replaced by the renter is as follows (refer to FIG. 9).

The CPU 23 detects whether the locking of the bicycle 1 to the terminal 2 has been completed correctly. If it has not, the CPU 23 can notify the renter of this by initiating an alarm, for example by supplying the speaker 19 which temporarily emits a siren noise, continuous or pulsed.

If, however, the locking has been completed correctly, the CPU 23 communicates to the terminal 2, via the transceiver 20, the data written to the flash memory 24.

As has been seen above, this data can contain identifiers characteristic:
- of a failure of one or more of the front 8 or rear 9 lighting circuits;
- of a failure of the brakes 14, 15;
- of an incomplete charge of the battery 22 or of a failure of the dynamo 21.

If such is the case, the terminal 2 identifies the corresponding failure or fault, blocks, when necessary, its locking system in order to prevent the subsequent use of the bicycle 1, and transmits to the maintenance department a message requesting servicing on the failed or defective element.

When the servicing has been done and the bicycle 1 is once again in working order, the flash memory 24 is reset (preferably by a maintenance technician), for example by actuating a "reset" button on the CPU 23 casing and the bicycle 1 is immediately made available for renting.

If the flash memory 24 contains no identifier characteristic of a failure or a fault, the bicycle 1 is immediately made available for subsequent renting.

The result of what has just been described is better ergonomy, from the point of view of the user, both for the bicycle 1 itself and, in the context of a rental system, of this system.

Moreover, the use of the on-board control system 23, specific to each bicycle 1, considerably simplifies the management of a fleet of bicycles—above all when this fleet is large—by making the detection of any fault or failure of the main elements of each bicycle systematic and by having maintenance intervene when necessary.

There is no need for the maintenance department to locate any defective bicycle since the terminal to which this bicycle is fixed is clearly identified.

The application of an on-board control system is not limited to the examples given above. Thus, it would be possible to detect any deflation or puncture of a tire by means of pressure detectors electrically linked to the CPU, the procedure followed in case of failure being the same as that described previously for failures of the lighting, brake, dynamo or battery circuits.

Moreover, the operation of the CPU 23 in accordance with the procedures described above can be provided by means of appropriate programming, within the scope of those skilled in the art.

The invention claimed is:

1. A bicycle, comprising:
   an on-board control system;
   a first communication interface electrically linked to the control system;
   at least one functional element, wherein said control system is configured to control the state of the functional element and communicate to a fixed infrastructure, via the first communication interface, status information concerning the state of said functional element; and
   at least one brake and a dynamo, and in which the control system comprises a memory and is configured to:
   detect an actuation of the brake,
   measure an electrical intensity of a current generated by the dynamo,
   write to the memory status information characteristic of a failure of the brake when the control system detects the actuation of said brake without detecting a reduction in said electrical intensity,
   transmit said status information characteristic of a failure of the brake to the first communication interface.

2. A bicycle, comprising:
   an on-board control system,
   a first communication interface electrically linked to the control system;
   at least one functional element, wherein said control system is configured to control the state of the functional element and communicate to a fixed infrastructure, via the first communication interface, status information concerning the state of said functional element; and
   two independent front lighting circuits, each comprising at least one front lamp, and in which the control system is configured to:
   supply current, at mid-power, to each front lighting circuit,
   detect a failure in any one of the front lighting circuits, and
   supply one of the front lighting circuits with current, at full power, when a failure has been detected in the other circuit.

3. The bicycle as claimed in claim 2, comprising a main rear lighting circuit comprising a first rear lamp, the control system being configured to:
   control said main rear lighting circuit, and
   detect a failure in said main rear lighting circuit.

4. The bicycle as claimed in claim 3, in which the main rear lighting circuit comprises, in series, a current amplifier, a light-emitting diode, and a current detector.

5. The bicycle as claimed in claim 3, comprising a secondary rear lighting circuit independent of the main rear lighting circuit, said secondary rear lighting circuit comprising a second rear lamp, and in which the control system is configured to control the secondary rear lighting circuit by making it operate when a failure has been detected in the main rear lighting circuit.

6. The bicycle as claimed in claim 5, in which the secondary rear lighting circuit comprises, in series, a current amplifier, a light-emitting diode, and a current detector.

7. The bicycle as claimed in claim 3, comprising at least one brake and a secondary rear lighting circuit independent of the main rear lighting circuit, said secondary rear lighting circuit comprising a second rear lamp, the control system being configured to:
   detect the actuation of the brake, and
   control the secondary rear lighting circuit by making it operate when the actuation of the brake has been detected.

8. The bicycle as claimed in claim 2, in which each front lighting circuit comprises, in series, a current amplifier, at least one light-emitting diode, and a current detector.

9. A bicycle, comprising:
   an on-board control system;
   a first communication interface electrically linked to the control system;
   at least one functional element, wherein said control system is configured to control the state of the functional element and communicate to a fixed infrastructure, via the first communication interface, status information concerning the state of said functional element and
   at least one front lighting circuit comprising at least one front lamp,
   at least one rear lighting circuit comprising a first rear lamp,
   a dynamo,
   a battery electrically linked to the dynamo to be recharged by said dynamo and at least partly supplying the front and rear lighting circuits,
   in which the control system is configured to:
   control the front and rear lighting circuits,
   measure the battery charge,
   reduce an electrical intensity supplying the front lighting circuits when the measured charge is less than a predetermined minimum value.

10. A bicycle, comprising:
    an on-board control system;
    a first communication interface electrically linked to the control system;
    at least one functional element, wherein said control system is configured to control the state of the functional element and communicate to a fixed infrastructure, via the first communication interface, status information concerning the state of said functional element, and wherein the control system further includes a memory and is configured to:
    receive an identification code via the first communication interface,
    write said identification code into the memory,
    detect an operation of the bicycle,
    if the bicycle is operating, compare the value of the identification code with at least one predetermined value, and
    depending on this comparison, initiate or not initiate an alarm reaction, in which the control system is configured to initiate the alarm reaction when the value of the identification code corresponds to said predetermined value.

11. The bicycle as claimed in claim 10, in which said first communication interface comprises a transceiver.

12. The bicycle as claimed in claim 11, in which said first communication interface is a short-range, contactless communication interface.

13. The bicycle as claimed in claim 10, in which the control system is configured to:

detect a fault in the operation of said functional element, and generate status information characteristic of said fault and communicate this status information to the first communication interface for transmission to said infrastructure.

14. The bicycle as claimed in claim 10, comprising:

at least one front lighting circuit comprising at least one front lamp, at least one rear lighting circuit comprising a first rear lamp, a dynamo, a battery electrically linked to the dynamo to be recharged by said dynamo and at least partly supplying the front and rear lighting circuits, in which the control system comprises a clock and is configured to:

control the front and rear lighting circuits, detect the operation of the dynamo, cut said front and rear lighting circuits when a time interval of predetermined duration has elapsed after the dynamo has stopped operating.

15. The bicycle as claimed in claim 10, in which the control system comprises a clock and is configured to:

detect an operation of the bicycle, after a predetermined period of operation of the bicycle, initiate an alarm reaction.

16. The bicycle as claimed in claim 10, comprising at least one lighting circuit which comprises at least one lamp, in which the control system is configured to intermittently control the lighting circuit as an alarm reaction.

17. The bicycle as claimed in claim 10, comprising a speaker controlled by the control system, and in which the control system is configured to have a sound signal sent to this speaker as an alarm reaction.

18. The bicycle as claimed in claim 10, in which the control system is configured to detect a movement of the bicycle and to determine that the bicycle is operating when a movement is detected.

19. The bicycle as claimed in claim 10, which can be locked on a fixed terminal, in which the control system is configured to:

detect locking of the bicycle on the fixed terminal, have an acknowledgement signal sent when the locking of the bicycle on the terminal has been detected.

20. The bicycle as claimed in claim 19, comprising at least one lighting circuit controlled by the control system, and said control system is configured to have said lighting circuit operate intermittently for a limited period as an acknowledgement signal.

21. An automatic bicycle rental system comprising at least one bicycle as recited by claim 10, comprising the infrastructure configured to receive said status information.

22. The automatic system as claimed in claim 21, comprising a plurality of bicycles and in which said infrastructure comprises:

a plurality of storage stations configured to receive on each at least one bicycle for storage purposes, and a plurality of short-range second communication interfaces configured to communicate with said first communication interfaces of the bicycles, each second communication interface of the infrastructure being associated with at least one storage station and disposed in the immediate vicinity of said storage station.

23. The automatic system as claimed in claim 22, in which each storage station comprises a fixed terminal.

24. The automatic system as claimed in claim 23, in which the fixed terminal comprises one of said second communication interfaces.

25. The automatic system as claimed in claim 22, in which said second communication interface is a contactless communication interface comprising a transceiver.

26. The automatic system as claimed in claim 22, in which the infrastructure also comprises at least one central station, centralizing said status information received by all the second communication interfaces.

* * * * *